United States Patent [19]

Hansen et al.

[11] Patent Number: 4,541,676

[45] Date of Patent: Sep. 17, 1985

[54] CHIP CARRIER TEST ADAPTER

[75] Inventors: William D. Hansen, Bell Gardens; Raymond F. Mix, Pomona, both of Calif.

[73] Assignee: ITT Corporation, New York, N.Y.

[21] Appl. No.: 591,149

[22] Filed: Mar. 19, 1984

[51] Int. Cl.[4] .................. H01R 13/627; H01R 23/72
[52] U.S. Cl. ............................. 339/17 CF; 339/91 R
[58] Field of Search .......... 339/17 CF, 75 M, 75 MP, 339/176 M, 176 MP, 174, 17 M, 200 P, 255 P, 91 R; 324/158 F, 158 P; 361/413

[56] References Cited

U.S. PATENT DOCUMENTS

| | | | |
|---|---|---|---|
| 3,866,119 | 2/1975 | Ardezzone et al. | 324/158 F |
| 3,968,433 | 7/1976 | Dobarganes | 324/158 F |
| 3,998,512 | 12/1976 | Anhalt et al. | 339/17 CF |
| 4,012,097 | 3/1977 | Long et al. | 339/45 M |
| 4,045,105 | 8/1977 | Lee et al. | 339/17 CF |
| 4,055,800 | 10/1977 | Fisk et al. | 334/72.5 |
| 4,116,519 | 9/1978 | Grabbe et al. | 339/17 CF |
| 4,331,373 | 3/1980 | Demnianiuk | 339/91 R |
| 4,395,084 | 7/1983 | Conrad | 339/75 MP |
| 4,406,508 | 9/1983 | Sadigh-Behzadi | 339/75 M |
| 4,417,777 | 11/1983 | Bamford | 339/17 CF |
| 4,508,403 | 4/1985 | Weltman et al. | 339/17 CF |

FOREIGN PATENT DOCUMENTS

57-18338  1/1982  Japan ................. 339/45 M

*Primary Examiner*—Neil Abrams
*Attorney, Agent, or Firm*—T. L. Peterson; R. C. Turner

[57] ABSTRACT

A test adapter for a chip carrier having leads along the four side edges thereof. The adapter comprises an inner housing having latches on its corners which engage the undersides of the corners of the carrier body to retain the adapter thereon. The adapter also includes an outer housing on which the test contacts are mounted. The outer housing is pushed downwardly to cause the contacts to engage the carrier chip leads with a positive wiping action.

17 Claims, 16 Drawing Figures

CHIP CARRIER TEST ADAPTER

BACKGROUND OF THE INVENTION

The present invention relates to a device for testing microchips which are contained in chip carriers and, more particularly, to a test adapter for microchip carriers having conductive leads along the four side edges thereof.

Until fairly recently solid state microelectronic devices were produced with twelve or fourteen active areas and these devices were packaged in rectangular insulating bodies, duel in-line packages in DIPs, having leads from the active areas extending from two opposite sides of the rectangular bodies. More recently, microcircuit devices have been produced in the form of square chips having active areas along all four side edges thereof. The standard chip carrier utilized today for this form of a microcircuit device comprises a square, low profile container having at least six leads extending from all four laterally facing side edges thereof. It is common practice to mount chip carrier of this type directly on a printed circuit board or to removable insert the chip carriers into chip carrier sockets, which in turn are mounted on the printed circuit board.

A number of test devices and clips are available for testing DIPs. An example of such a clip is disclosed in U.S. Pat. No. 4,012,097 to Long et al. Test contacts are provided on the clip body along two side edges thereof for engaging the leads of the DIP. Upstanding levers are pivotally mounted on the opposite ends of the body. Each lever carries a pair of contacts which engage with and latch onto the leads at the opposite ends of the two rows of leads on the DIP. Test leads or probes may be electrically connected to selected leads of the DIP by engaging the contacts of the test clip which are accessible at the top of the clip. While various test devices are available for testing DIPs, to our knowledge no such device has been provided for chip carriers having leads along the four side edges thereof. It is the object of the present invention to provide such a test clip or adapter.

Another object of the invention is to provide a test adapter for a chip carrier having conductive leads along four side edges thereof which may be latched onto the carrier without engaging the leads thereof.

A further object of the invention is to provide such a test adapter in which the contacts thereof engage the leads of the carrier with a positive wiping action to assure that good electrical connection is made between the contacts and the leads.

SUMMARY OF THE INVENTION

According to a principal aspect of the present invention, there is provided a test adapter for a chip carrier having leads along the four side edges of the insulative body of the carrier. The adapter comprises inner and outer housings. The oter housing comprises a generally rectangular frame defined by four walls. Test contacts are carrier by the four walls and are arranged to engage the chip carrier leads when the adapter is mounted over the carrier. Latching elements are provided on the inner housing which engage the carrier to retain the test adapter thereon. In a preferred embodiment of the invention, the latching elements are mounted on diagonally opposed corners of the inner housing of the test adapter, and are adapted to engage the underside of the carrier body at the corners thereof so that the latching elements do not engage the carrier leads as in the aforementioned Long et al. patent which could cause damage to the leads. The outer housing of the adapter is movable downwardly relative to the inner housing to cause the test contacts to engage the chip carrier leads with a positive wiping action thereby ensuring a good electrical connection therebetween.

Other aspects and advantages of the invention will become more apparent from the following description taken in connection with the accompanying drawings.

DESCRIPTION OF THE PREFERRED EMBODIMENT

Figure 1:
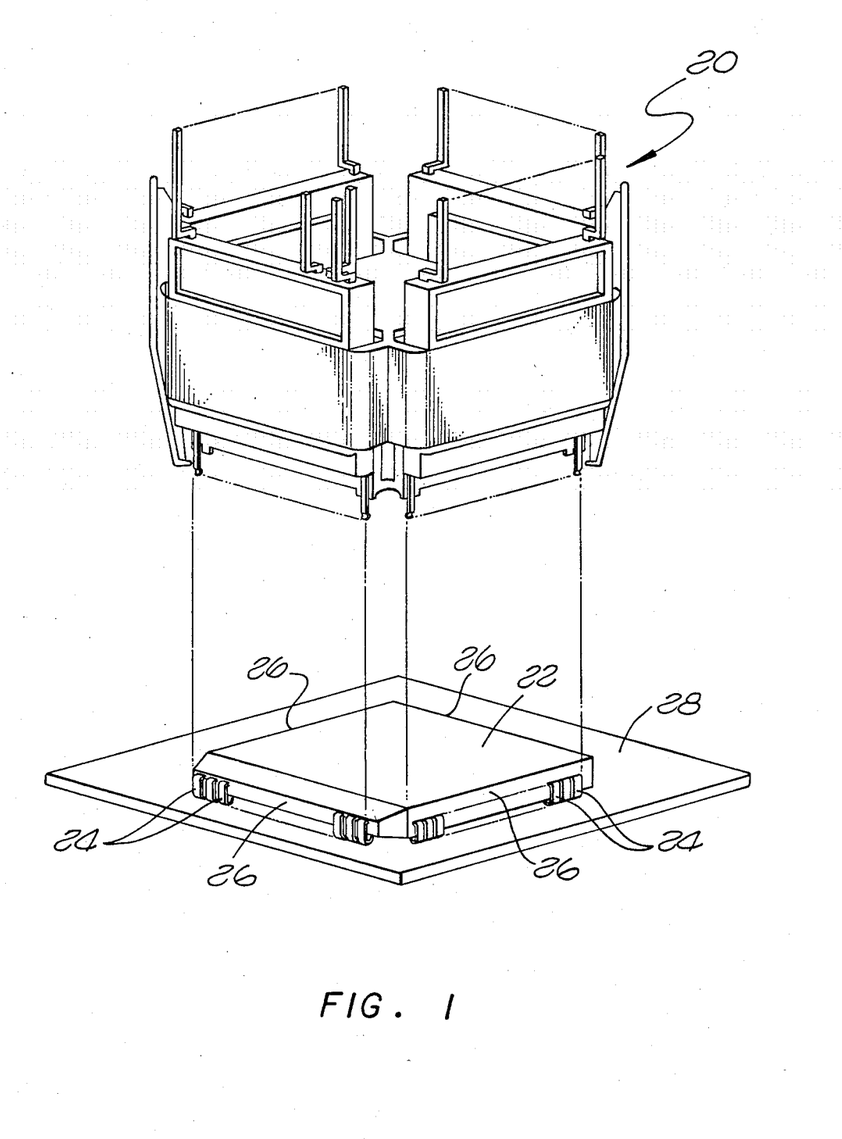
FIG. 1 is an exploded, perspective view showing the test adapter of the invention positioned above a chip carrier mounted on a printed circuit board.
Figure 2:
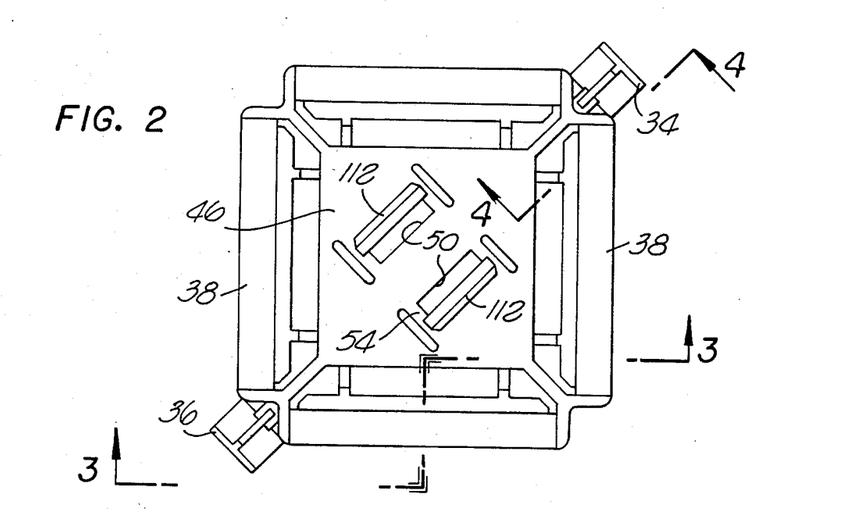
FIG. 2 is a top plan view of the test adapter of the invention.

Referring now the the drawings in detail, there is illustrated in FIG. 1 the test adapter of the present invention, generally designated 20, which is adapted to be mounted over a square chip carrier 22 which has conductive leads 24 along the four side edges 26 thereof. The carrier is mounted on a printed circuit board 28 in a conventional manner.

Basically, the test adapter comprises an inner housing 30 which is adapted to be seated on top of the chip carrier, and an outer housing 32 which is slidable downwardly relative to the inner housing. Latch arms 34 and 36 located at diagonally opposed corners of the inner housing 30 serve to lock the inner housing, and thus the adapter, onto the chip carrier. The outer housing 32 includes four contact housings 38 mounted around its four sides. Each housing 38 contains a row of contacts 40 which engage the leads on the chip carrier when the outer housing is pushed downwardly from the position illustrated in FIG. 5 to the position illustrated in FIG. 6.

Figure 7:
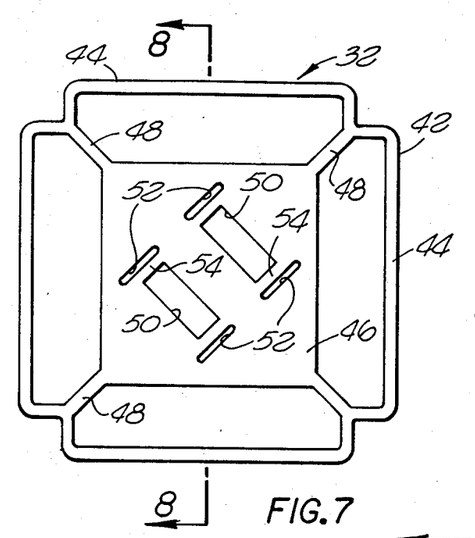
FIG. 7 is a top plan view of the outer housing of the test adapter.
Figure 8:
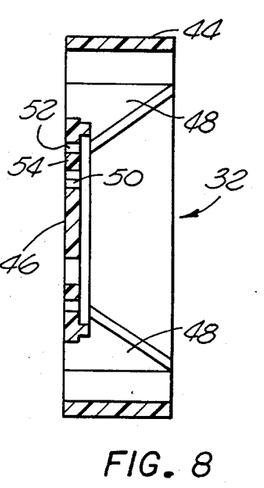
FIG. 8 is a vertical sectional view of the outer housing taken along line 8—8 of FIG. 7.

As best seen in FIGS. 7 and 8, the outer housing comprises a generally square frame 42 defined by vertical side walls 44. The outer housing also includes a square inner latch plate 46 which is located within the interior of the inner housing 30 and is joined to the side walls 44 of the outer housing by diagonally extending connecting webs 48. A pair of diagonally extending rectangular openings 50 are formed in the latch plate 46. Elongated slots 52 are cut in the latch plate adjacent to the ends of the openings 50 providing therebetween resilient sections 54 which serve a purpose which will be described later herein.

Figure 9:
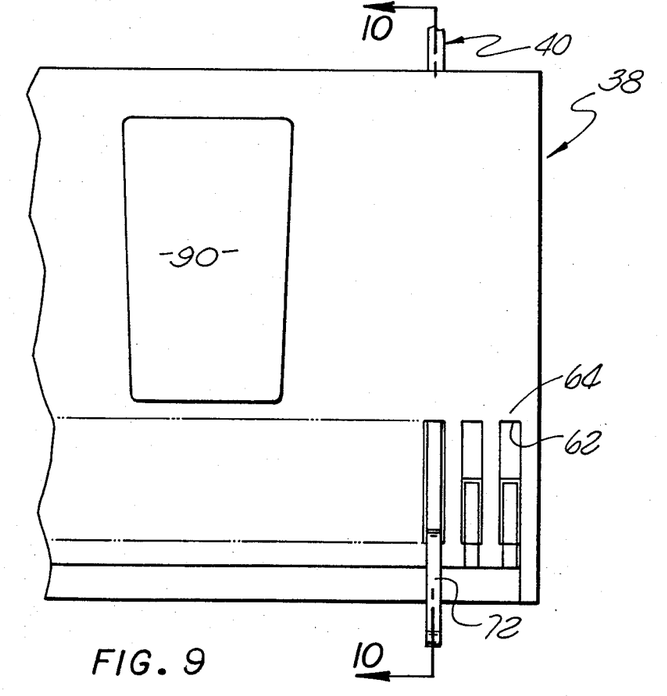
FIG. 9 is an elevational view showing the inside surface of one of the contact housings which are mounted in the outer housing of the adapter.
Figure 10:
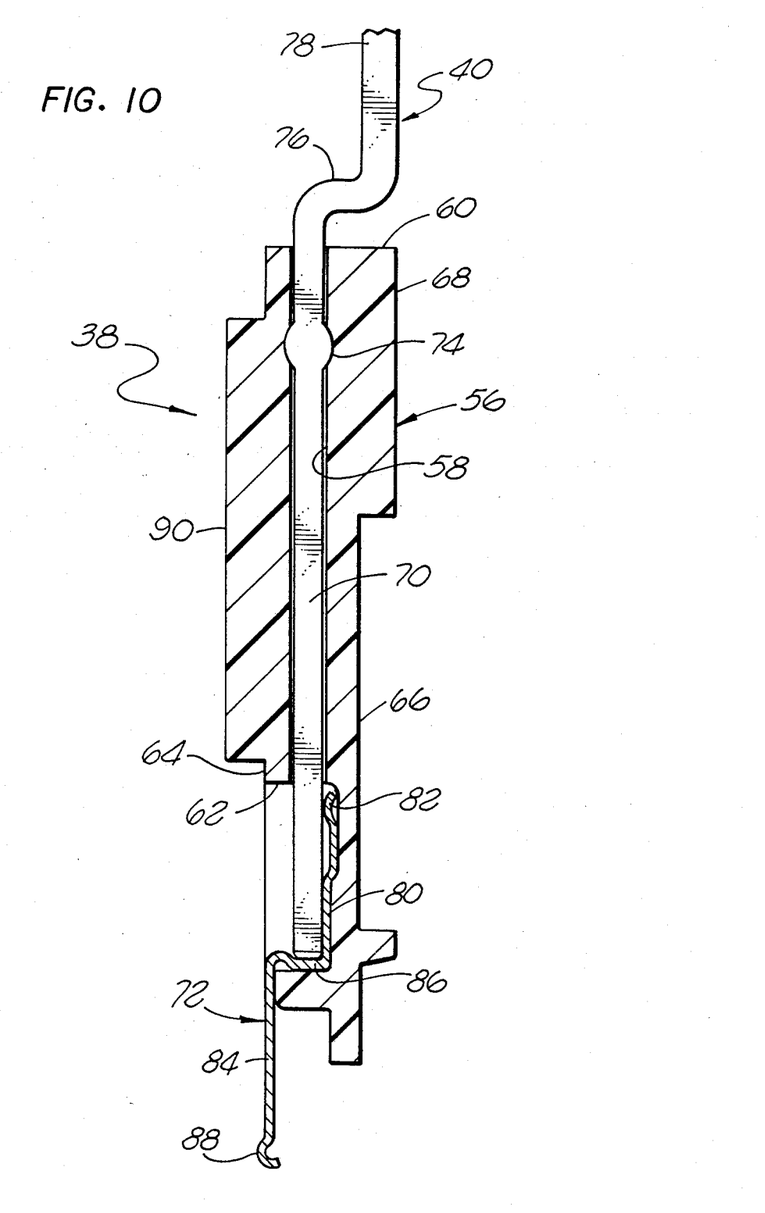
FIG. 10 is a vertical sectional view taken along line 10—10 of FIG. 9 showing the details of structure of the terminal and clip which form a test contact of the adapter.

Reference is now made to FIGS. 9 and 10 which show the details of structure of one of the contact housings 38 which is mounted in the frame 42 of the outer housing and form a part thereof. Each contact housing comprises a relatively thin, upstanding insulator 56 having a vertical passage 58 exending from the top 60 thereof downward to a recess 62 that opens to the side 64 of the insulator which faces inwardly toward the inner housing when the contact housing is mounted in the frame 42. A horizontally extending groove 66 is formed in the outer surface 68 of the insulator 56. The height of the groove is slightly greater than the height of the side wall 44 of the frame 42. The contact housing 38 is mounted onto the frame 42 of the outer housing by inserting the contact housing within the interior of the frame with the groove 66 aligned with the side wall 44 of the frame. The housing is then moved outwardly until the side wall fits within the groove as can be best seen in FIG. 3.

Figure 3:
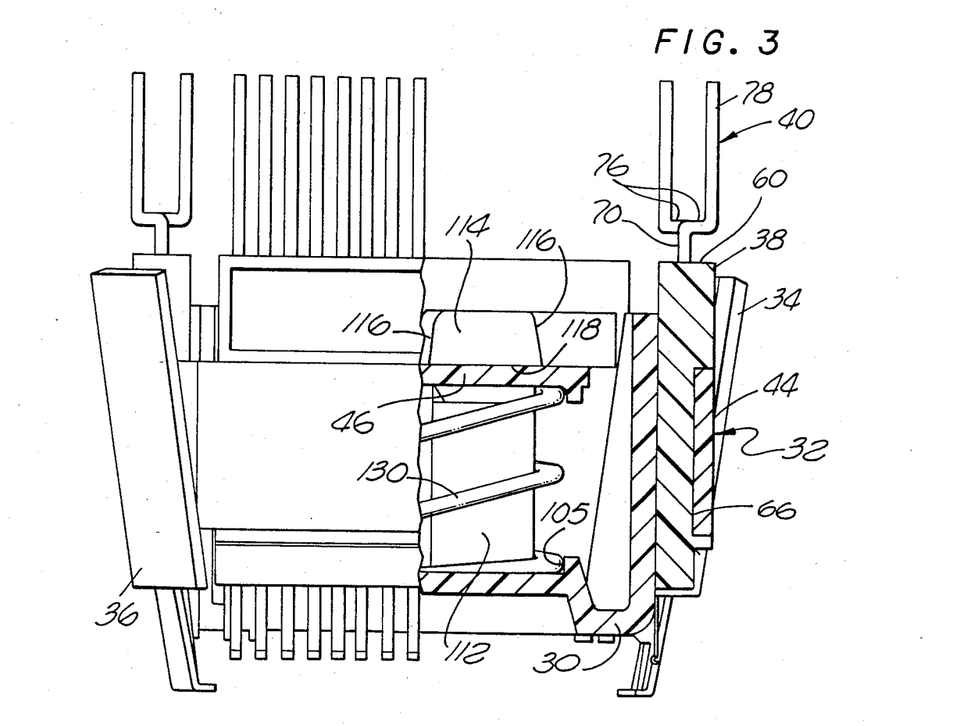
FIG. 3 is a vertical sectional view taken along line 3—3 of FIG. 2 showing the internal construction of the adapter.

Each contact 40 mounted in the housing 38 comprises a square pin test terminal 70 and a spring contact 72. The test terminal 70 is mounted in the passage 58 in the housing. The terminal includes an enlarged mounting portion 74 which has a press fit engagement with the wall of the passage 58. As seen in FIG. 3, each terminal extends upwardly beyond the top 60 of the contact housing. The terminal has a double bend just above the top 60 to provide a laterally extending portion 76 and an upper end portion 78 which is offset from the center axis of the terminal. Adjacent terminals 70 are mounted in the housing 30 so that the upper end portions 78 of the terminals are offset on opposite sides from the center axes of the terminals thereby providing greater spacing between the tips and facilitating engagement of the tips of the terminals by test probes, alligator clips or the like.

Figures 4, 5, 6:
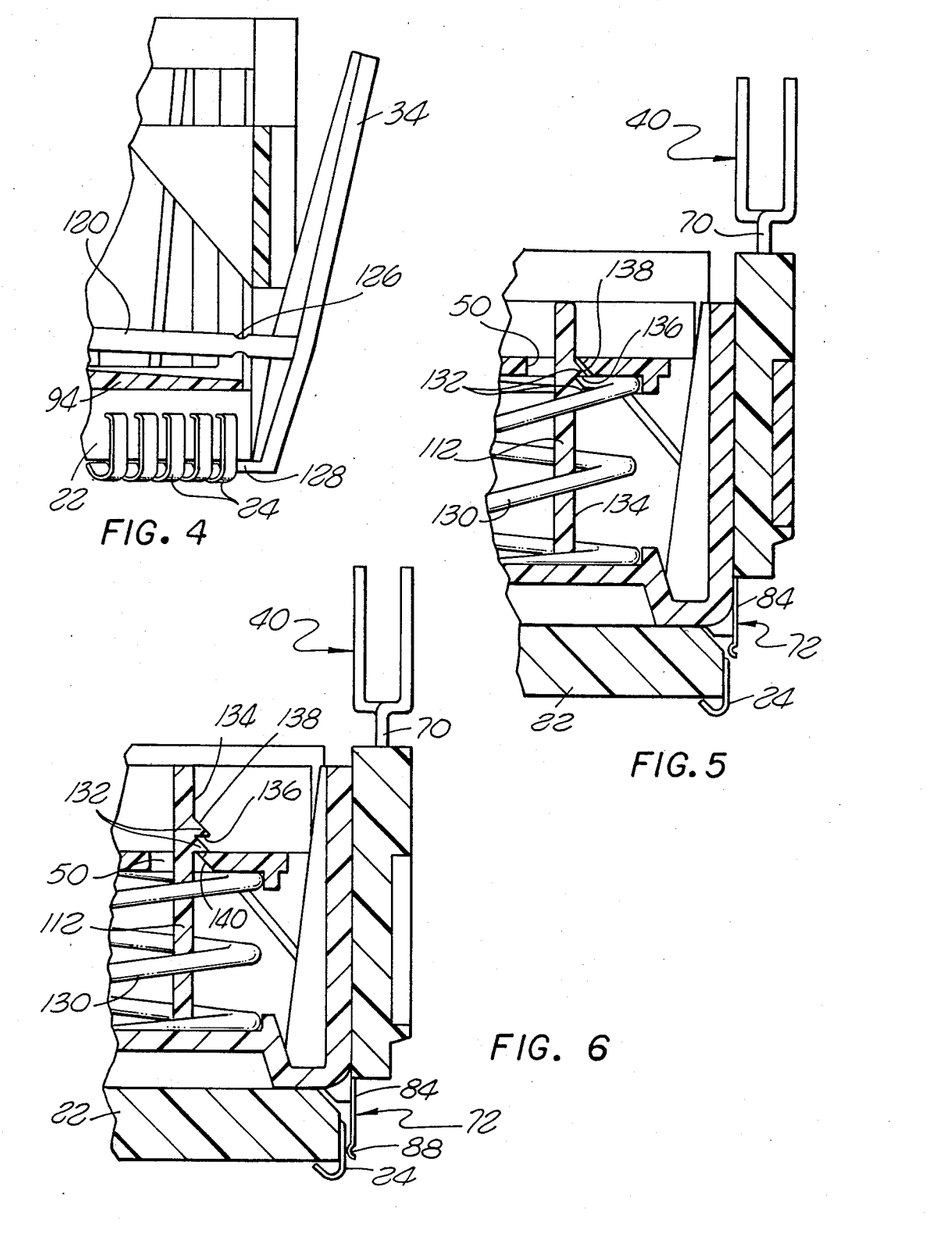
FIG. 4 is a fragmentary vertical sectional view of the adapter taken along line 4—4 of FIG. 2, with the adapter being shown mounted on a carrier, and one of the latch arms of the adapter hooked onto the carrier.
FIG. 5 is a fragmentary vertical sectional view similar to the right hand portion of FIG. 3 showing the adapter mounted on a chip carrier with the contacts thereof disengaged from the chip carrier leads.
FIG. 6 is a fragmentary vertical sectional view similar to FIG. 5 but showing the test adapter contacts engaged with the chip carrier lead.

The spring contact 72 has an upper vertical section 80 which extends along the bottom of the recess 62 and terminates with a bowed contacting region 82 that is slidably engaged with the lower end of the test terminal 70 when the latter is mounted into the passage 58. The lower portion 84 of the spring contact 72 is offset from the upper portion 80 by a laterally extending section 86 that lies along the bottom edge of the recess 62. The bottom tip of the test terminal 70 bears against the lateral section 86 of the spring contact 72 to retain the contact in the housing 38. The lower end of the spring contact 72 is formed with an inwardly extending bowed contacting section 88 which engages the carrier chip lead when the outer housing of the adapter is pushed downwardly to its contacting position as illustrated in FIG. 6. A generally rectangular guide projection or key 90 is located in the center of the insulator 56 of the contact housing which projects outwardly from the surface 64 of the insulator and cooperates with a corresponding keyway or slot formed in the inner housing which will be described later.

Figure 11:
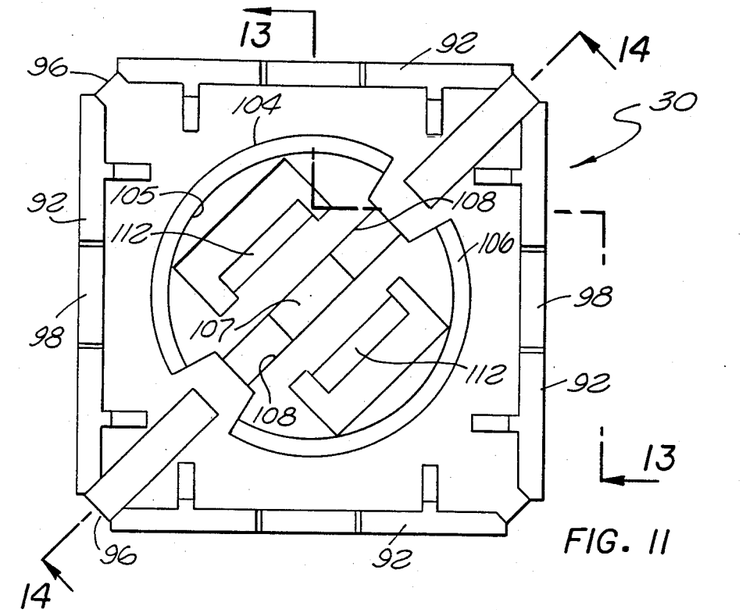
FIG. 11 is a top plan view of the inner housing of the adapter.
Figure 12:
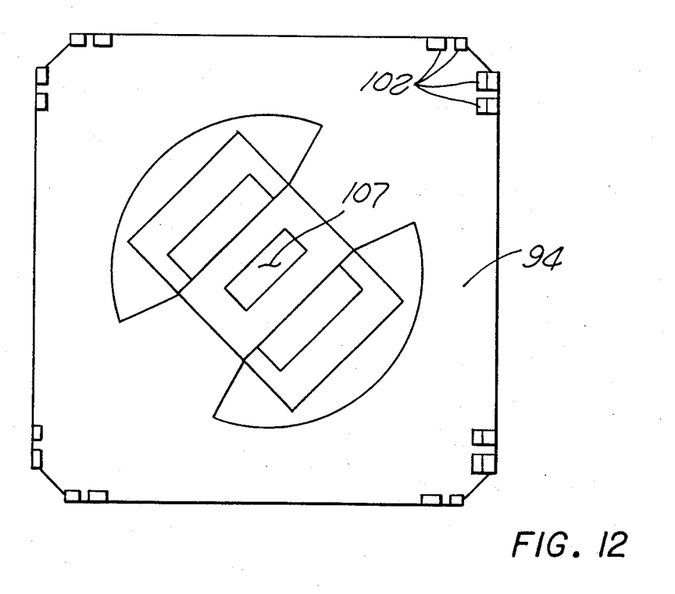
FIG. 12 is a bottom view of the inner housing.
Figure 13:
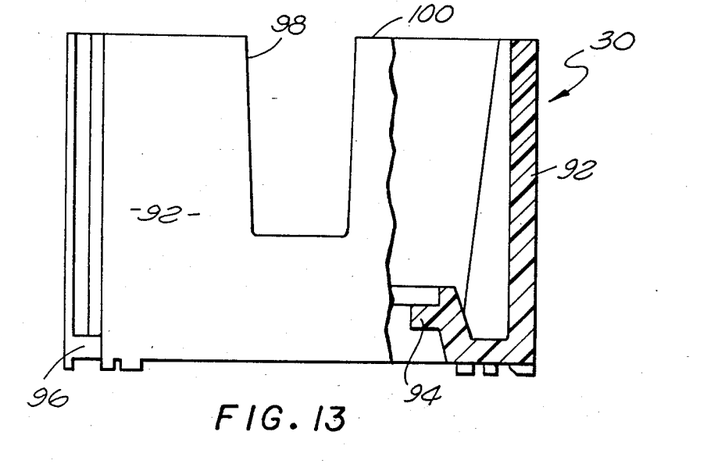
FIG. 13 is a vertical sectional view through the inner housing taken along line 13—13 of FIG. 11.
Figure 14:
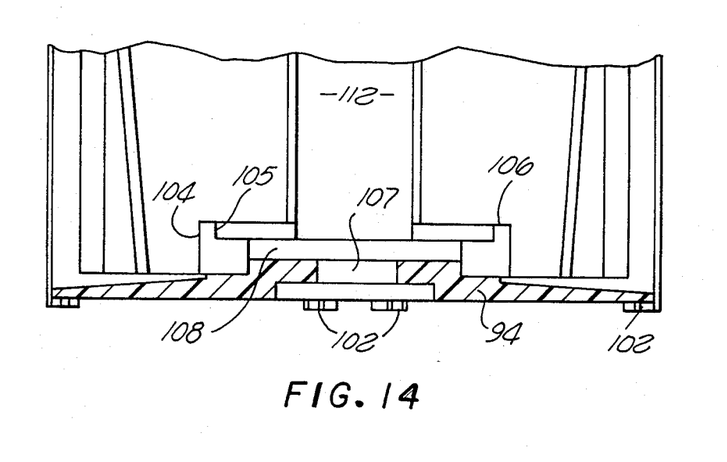
FIG. 14 is a fragmentary vertical sectional view taken along line 14—14 of FIG. 11 showing the details of structure of the lower portion of the inner housing.

The details of structure of the inner housing 30 may best be seen by referring to FIGS. 11-14. The inner housing has a square configuration, and comprises four side walls 92 and a bottom wall 94. As seen in FIG. 11, the ends of the walls 92 are spaced from each other providing open gaps 96 at the corners of the inner housing. The inner housing is dimensioned to have a sliding fit within the outer housing 32 with the contact housings 38 mounted therein, as best seen in FIG. 3, whereby the walls 92 of the inner housing serve to retain the contact housings within the square frame 42 of the outer housing. A slot or keyway 98 is formed in the center of each wall 92 and opens to the upper edge 100 thereof. The slot 98 receives the guide projection 90 on the contact housing 38 to assure precise positioning of the contact housings relative to the inner housing. The inner housing includes four locating tabs 102 adjacent to each corner on the bottom of the bottom wall 94, as seen in FIG. 12, which are positioned to engage the sides of the chip carrier body when the adapter is mounted thereover to precisely position the inner housing thereon and, thus, precisely locate the contacts in the contact housings 38 so that they are aligned with the leads of the chip carrier.

A circular boss 104 extends upwardly from the bottom wall 94 of the inner housing. A circular recess 105 is located in the center of the boss and opens at its upper surface 106. A small diagonally extending slot 107 is formed in the center of the bottom of the recess 105. The slot extends through the bottom wall 94. A diagonally extending channel 108 is formed in the boss 104 intersecting the slot 107. A latch arm assembly 110 (illustrated in FIGS. 15 and 16) is mounted within the slot 107 and the channel 108. The latch arm assembly will be described in further detail later.

A pair of resilient latch fingers 112 extend upwardly from the boss 104 on the lower wall of the inner housing. The fingers are relatively flat, and extend diagonally relative to the side walls of the housing 30. The fingers are positioned so that they may extend upwardly through the rectangular diagonally disposed openings 50 in the latch plate 46 of the outer housing when the inner housing is assembled within the outer housing as seen in FIG. 3. The latch fingers 112 are resilient so that they are capable of being deflected laterally toward each other. The width of each latch finger 112 is slightly less than the length of the opening 50 in the latch plate so that the finger may extend through the opening.

Each latch finger 112 embodies an upper enlarged head 114 which is located above the latch plate 46 when the inner housing is assembled to the outer housing. The side edges 116 of the head 114 taper downwardly and outwardly to form downwardly facing retaining shoulders 118 that bear against the upper surface of the latch plate to secure the inner and outer housings together. The enlarged head 114 is capable of moving upwardly through the opening 50 in the latch plate due to the fact that the relatively thin sections 54 formed between the ends of the opening and the slots 54 are resilient, and deflect outwardly allowing the head to pass therethrough. After the head passes through the opening, the resilient sections 54 snap inwardly so that the finger 112 will lock the inner housing to the outer housing. In the embodiment shown, it is not practical to disengage the retaining shoulders 118 of the head 114 of the latch fingers 112 from the latch plate to disassemble the inner housing from the outer housing, nor is it necessary to do so.

Figures 15, 16:
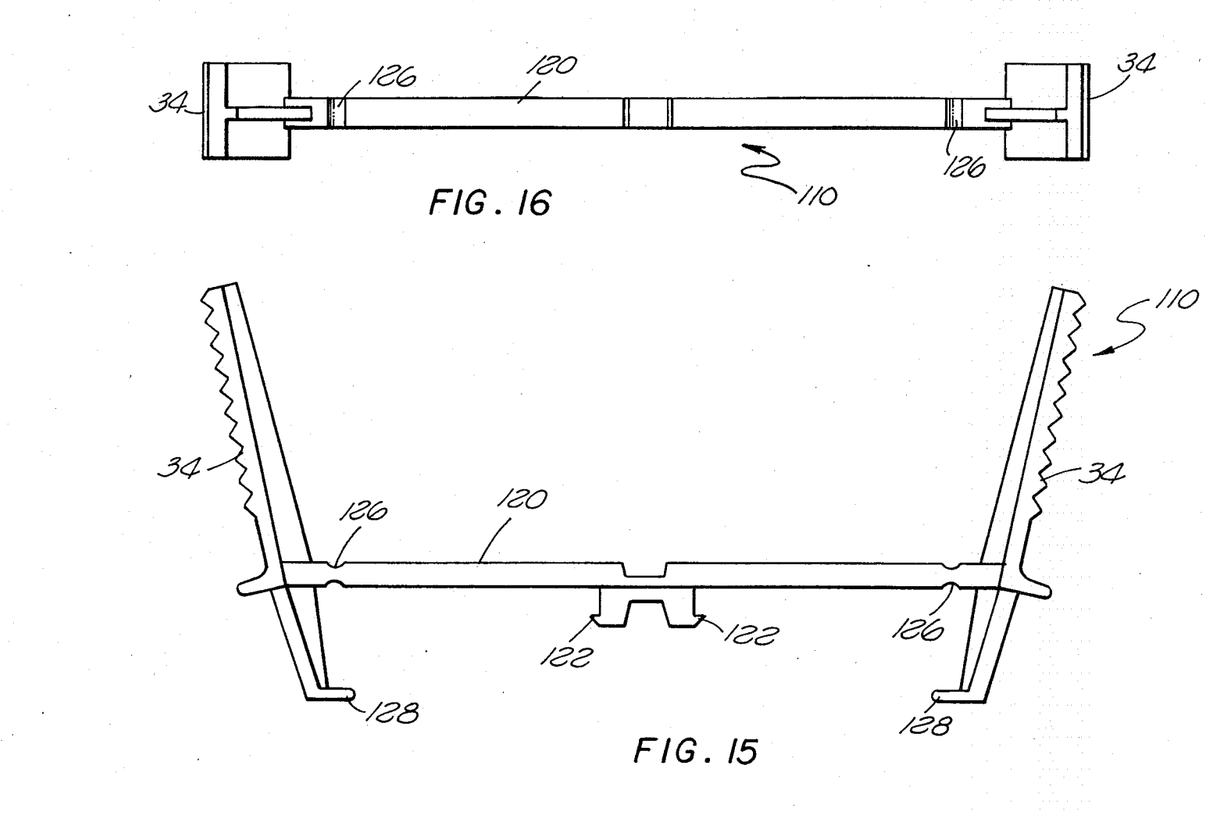
FIG. 15 is a side elevational view of the latch arm assembly utilized in the test adapter.
FIG. 16 is a top view of the latch arm assembly illustrated in FIG. 15.

Reference is now made to FIGS. 15 and 16 which illustrate the latch arm assembly 110 of the present invention which embodies the latch arms 34 that retain the test adapter on the chip carrier. The latch arm assembly comprises an elongated strip 120 which interconnects the latch arms 34. The strip embodies a central snap locking assembly 122 which is dimensioned to fit within the slot 107 formed in the boss 104 in the bottom wall of the inner housing. The width of the strip 120 is slightly less than the width of the channel 108 which extends diagonally across the boss 104. Thus, the latch arm assembly 110 may be assembled onto the inner housing 30 from the top thereof by aligning the strip 120 with the channel 108 and dropping the latch arm assembly into the channel with the central snap locking assembly 122 thereof located within the recessed slot 107. The end portions of the connecting strip 120 will extend outwardly through the gaps 96 formed at the corners of the inner housing. Preferably, small notches 126 are formed in the upper and lower surfaces of the connecting strip 120 to enhance the resilience of the end portions of the strip and thus deflection of the latch arms 34. Each latch arm embodies an inwardly extending hook 128 at its lower end which engages under the underside of the corner of the carrier chip body when the adapter is mounted thereover. A coil spring 130 is mounted in the inner housing 30. The lower portion of the coil spring sits within the circular recess 105 in the boss 104 on the bottom wall of the inner housing. The upper end of the coil spring bears against the bottom of the latch plate 46.

As seen in FIGS. 5 and 6, each latch finger 112 has a pair of locking tangs 132 on its outwardly facing surface 134, one tank being located above the other. Each tang has a downwardly facing shoulder 136 and a tapered upper surface 138. A corresponding tapered surface 140 is formed on the side of the opening 50 adjacent to the tangs. The tangs 132 cooperate with the edge of the opening 50 in the latch plate to releasably retain the outer housing 32 of the adapter in a depressed condition, as seen in FIG. 6, wherein the spring clips 84 on the contacts engage the leads on the chip carrier. The operator may engage the upper ends of the latch fingers to deflect them inwardly toward each other to remove the shoulders 136 on the locking tangs from the upper surface of the latch plate to allow the outer housing 32, and thus the test contacts, to move upwardly thereby breaking the connection between the test contacts and the chip carrier leads. The coil spring 130 automatically moves the outer housing upwardly when the latch fingers 112 are deflected by the user to release the locking tangs 132 from the latch plate.

To assemble the test adapter of the present invention, the four contact housings 38 are positioned inside the outer housing and shifted outwardly so that the walls of the square frame 42 are lodged within the groove 66 in the outer surfaces of the contact housing. The latch arm assembly 110 is mounted in the bottom of the inner housing, and the coil spring 130 is mounted over the top of the latch arm. The inner housing is then pushed upwardly into the outer housing until the enlarged head 114 on the latch fingers 112 pass through the openings 50 in the latch plate 46 thereby locking the inner housing within the outer housing. The coil spring 130 is of such a length that it will be compressed when the inner and outer housings are assembled together. Thus, it will be appreciated that all the parts of the test adapter of the invention are assembled together without the need of any secondary operations, such as cementing, fusing or soldering.

To mount the test adapter 20 of the invention over the chip carrier 22 to test the integrated circuit chip therein, initially the operator engages the upper ends of the latch arms 34 to deflect them toward each other, thereby shifting the lower ends carrying the hooks 128 outwardly. The test adapter is fit over the carrier with the inner housing thereof precisely positioned on the carrier body by the locating tabs 102 and the latch arms are released to cause the hooks 128 to fit under the corners of the carrier body. Thus, no engagement of the hooks is made with the carrier leads which could cause damage thereto. The condition of the test adapter at this point is as illustrated in FIGS. 4 and 5. The operator then pushes the outer housing of the adapter downwardly to cause the spring contacts 72 to have a positive wiping engagement with the chip carrier leads. During this downward movement of the outer housing, the latch fingers 112 will automatically deflect inwardly toward each other by virtue of the tapered side edges 140 on the latch plate engaging the tapered surfaces 138 on the locking tangs 132. Since two locking tangs 132 are provided on each finger 112, the operator has a choice as to distance which he may latch the outer housing relative to the inner housing, which will be dependent upon the height of the leads of the chip carrier. The operator may then connect suitable test equipment to the upper end portions 78 of the test contacts to electrically engage the desired leads on the chip carrier. To release the adapter from the carrier, the operator uses two fingers to squeeze the latch fingers 112 inwardly toward each other to release the locking tangs 132 from the latch plate 146 whereupon the coil spring 130 will automatically shift the outer housing, and thus the contacts 40 upwardly out of engagement with the chip leads.

The operator then uses two fingers to squeeze the upper ends of the latch arms 34 to remove the hooks 128 from underneath the carrier body.

What is claimed is:

1. A test adapter for a chip carrier having leads along the four side edges of the insulative body of the carrier and mounted on a printed circuit board comprising:
a rectangular housing containing a plurality of test contacts arranged in a pattern to engage exterior portions of said chip carrier leads which extend between the carrier body and the printed circuit board along said four side edges when said housing is mounted over said carrier; and
latching means mounted on at least two diagonally opposed corners of said housing adapted to engage the underside of said carrier body at the corners thereof and between the carrier body and the printed circuit board to retain the test adapter on the carrier.

2. A test adapter as set forth in claim 1 wherein:

each said test contact comprises an upper relatively rigid termination portion extending outwardly from the upper portion of said housing, and a lower resilient spring portion; and means is provided causing said spring portion to engage one of said leads with a positive wiping action when said housing is mounted over said carrier.

3. A test adapter as set forth in claim 1 wherein:

said housing comprises first and second parts vertically movable relative to each other; and said latching means is mounted on said first part and said test contacts are mounted on said second part.

4. A test adapter as set forth in claim 3 wherein:

said second part is movable vertically relative to said first part and the chip carrier after said first part is latched to said carrier body to bring said contacts into engagement with the chip carrier leads with a positive wiping action.

5. A test adapter as set forth in claim 4 including:

second latching means operable between said first and second parts for holding said second part in a position wherein said test contacts engage said chip carrier leads.

6. A test adapter as set forth in claim 5 wherein:

said second latching means is releasable; and spring means is provided between said parts to cause said second part to be automatically shifted away from the chip carrier when said second latching means is released, to disengage said test contacts from the chip carrier leads.

7. A test adapter for a chip carrier having leads along the four side edges of the insulative body of the carrier and mounted on a printed circuit board comprising:

inner and outer housings;

said outer housing being a generally rectangular frame defined by four walls and mounted on and substantially surrounding said inner housing;

test contacts carried by said four walls arranged to engage said chip carrier leads when said housings are mounted over said carrier;

latching means on said inner housing dapted to engage the underside of said carrier between the carrier body and the printed circuit board to retain the test adapter thereon; and said outer housing being movable downwardly relative to said inner housing to cause said test contacts to engage said chip carrier leads which extend between the carrier body and the printed circuit board with a positive wiping action.

8. A test adapter as set forth in claim 7 wherein:

said latching means comprises latch arms mounted on diagonally opposed corners of said inner housing adapted to engage the underside of said carrier body at the corners thereof.

9. A test adapter as set forth in claim 7 wherein:

said test contacts are mounted in four individual insulative contact housings; and said contact housings are releasably mounted on said four walls.

10. A test adapter as set forth in claim 9 wherein:

said inner housing has a rectangular configuration defined by four walls each facing a wall of said outer housing; and said contact housings are trapped between said facing walls of said inner and outer housings.

11. A test adapter as set forth in claim 7 including:

second latching means between said inner and outer housings to hold said outer housing in a downward position wherein said test contacts will engage said chip carrier leads.

12. A test adapter as set forth in claim 11 wherein:

said inner housing has a bottom wall;

said outer housing includes a central latch plate fixed thereto and positioned above said bottom wall of said inner housing; and said second latching means is operatively associated with said bottom wall and said latch plate.

13. A test adapter as set forth in claim 12 wherein:

said second latching means includes at least one resilient latch finger connected to said bottom wall extending upwardly through an opening in said latch plate, said finger embodying a latch tang engageable with the upper surface of said latch plate, and said finger extending above said latch plate so that it may be deflected laterally to disengage said latch tang from said upper surface.

14. A test adapter as set forth in claim 13 including:

spring means extending between said bottom wall and said latch plate.

15. A test adapter as set forth in claim 14 wherein:

said first-mentioned latching means comprises a pair of latch arms, said arms being joined by an interconnecting strip;

said strip extending diagonally across said bottom wall of said inner housing; and said latch arms being located outside said outer housing at diagonally opposed corners thereof for engaging the underside of said carrier body at the corners thereof.

16. A test adapter as set forth in claim 7 including:

means on said inner housing for precisely locating said inner housing on said carrier body so that the test contacts on said outer housing are aligned with the chip carrier leads.

17. A test adapter for a square chip carrier having leads along the four side edges of the insulative body of the carrier and mounted on a printed circuit board comprising:

generally square inner and outer housing;

said outer housing mounted on and substantially surrounding said inner housing;

test contacts carried by the four walls of said outer housing;

means on said inner housing for precisely locating said inner housing on said carrier body so that the test contacts on said outer housing are aligned with the chip carrier leads;

latching means on the corners of said inner housing adapted to engage the underside of said carrier body between the carrier body and the printed circuit board at corresponding corners thereof to retain the test adapter on the carrier;

said outer housing being movable downwardly to a predetermined position relative to said inner housing to cause a wiping engagement of said test contacts with said chip carrier leads; and means for releasably holding said outer housing in said predetermined position.

* * * * *